(12) United States Patent
Nakano et al.

(10) Patent No.: US 10,852,253 B2
(45) Date of Patent: Dec. 1, 2020

(54) SPECIMEN OBSERVATION METHOD

(71) Applicant: HITACHI HIGH-TECH CORPORATION, Tokyo (JP)

(72) Inventors: Kiyotaka Nakano, Tokyo (JP); Eiko Nakazawa, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/085,743

(22) PCT Filed: Mar. 18, 2016

(86) PCT No.: PCT/JP2016/058622
§ 371 (c)(1),
(2) Date: Sep. 17, 2018

(87) PCT Pub. No.: WO2017/158806
PCT Pub. Date: Sep. 21, 2017

(65) Prior Publication Data
US 2019/0051489 A1   Feb. 14, 2019

(51) Int. Cl.
*G01N 23/04* (2018.01)
*G01N 23/2251* (2018.01)
(Continued)

(52) U.S. Cl.
CPC .............. *G01N 23/04* (2013.01); *G01N 1/38* (2013.01); *G01N 23/225* (2013.01); *G01N 23/2251* (2013.01); *H01J 37/20* (2013.01); *H01J 37/28* (2013.01); *G01N 2223/418* (2013.01); *H01J 2237/2002* (2013.01); *H01J 2237/206* (2013.01); *H01J 2237/244* (2013.01);
(Continued)

(58) Field of Classification Search
None
See application file for complete search history.

(56) References Cited

U.S. PATENT DOCUMENTS

2011/0057100 A1* 3/2011 Nakazawa ............. G01N 23/04
                                                                    250/307
2012/0120226 A1* 5/2012 de Jonge ............ G01N 23/2251
                                                                    348/80

FOREIGN PATENT DOCUMENTS

JP    3165429 B2 * 5/2001
JP    2009-266741    11/2009
(Continued)

OTHER PUBLICATIONS

Japanese Office Action dated May 14, 2019 for JP Application No. 2018-084953 (with Machine translation).
(Continued)

*Primary Examiner* — Andrew Smyth
(74) *Attorney, Agent, or Firm* — Miles & Stockbridge, P.C.

(57) ABSTRACT

A device for observing a specimen, such as a charged particle beam device exemplified by a scanning electron microscope and a transmission electron microscope in which an operator can specify minute bubbles with high contrast in a charged particle beam image of a liquid subjected to processing of generating bubbles, using a phenomenon in which contrast as high as an operator can specify minute bubbles is provided in a charged particle beam image of a specimen including an ionic liquid and a liquid subjected to processing of generating bubbles, thus making it possible to recognize minute bubbles in a liquid.

12 Claims, 9 Drawing Sheets

(51) Int. Cl.
*G01N 1/38* (2006.01)
*H01J 37/20* (2006.01)
*G01N 23/225* (2018.01)
*H01J 37/28* (2006.01)

(52) U.S. Cl.
CPC ............... *H01J 2237/2802* (2013.01); *H01J 2237/2803* (2013.01); *H01J 2237/2809* (2013.01)

(56) References Cited

FOREIGN PATENT DOCUMENTS

| | | | |
|---|---|---|---|
| JP | 3165429 | | 1/2011 |
| JP | 3165429 U | * | 1/2011 |
| JP | 3165429 U | * | 1/2011 |
| JP | 2011-137807 A | | 7/2011 |
| JP | 2011137807 A | * | 7/2011 .............. H01J 37/20 |
| JP | 2011-157580 | | 8/2011 |
| JP | 2016-095183 | | 5/2016 |

OTHER PUBLICATIONS

Takanori Nakayama et al., "Observation of ionic liquid interface in a nanotube", The Japan Society of Mechanical Engineers Kyushu Branch Koen Ronbunshu, Mar. 17, 2011, No. 118-1, pp. 261 to 262.
International Search Report dated Jun. 21, 2016 for International Application No. PCT/JP2016/058622.
Office Action dated May 8, 2020 in corresponding Chinese Application No. 201680083602.5.

* cited by examiner

[Fig. 1]
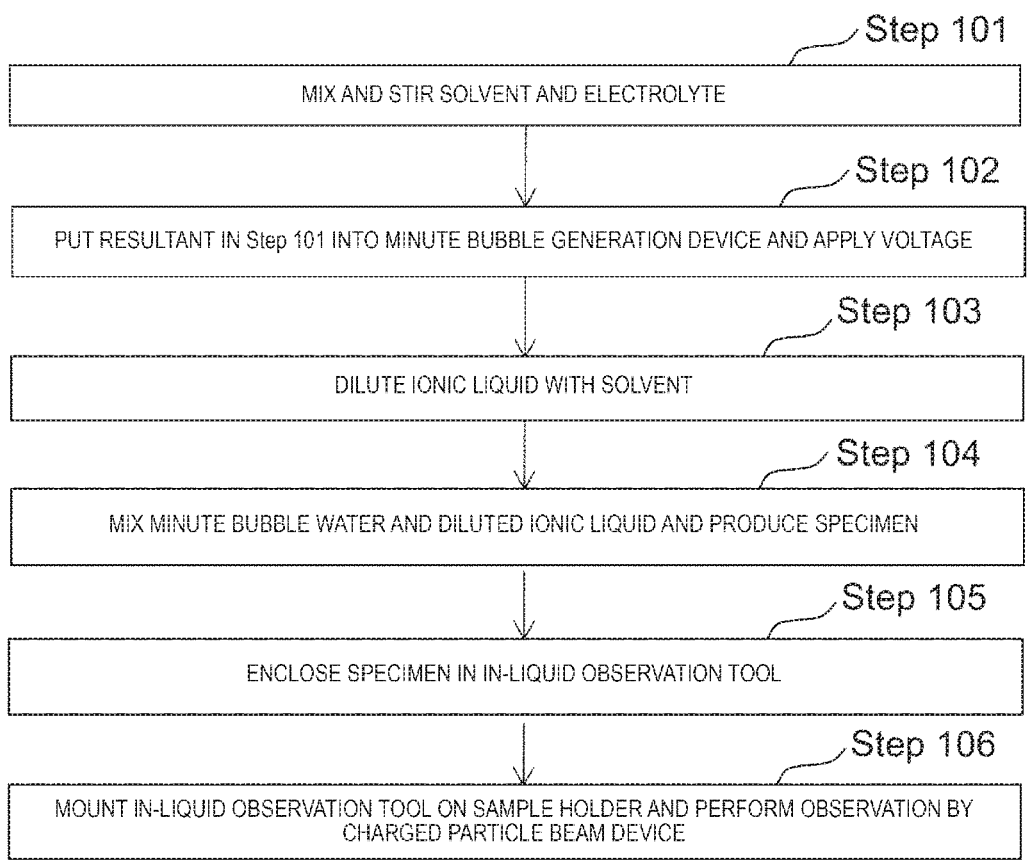

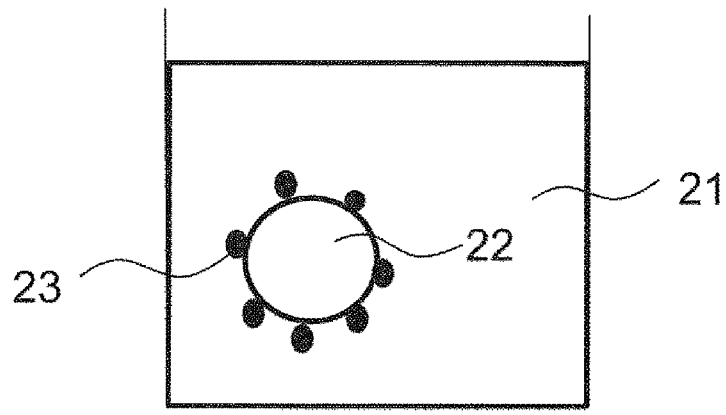
[FIG. 2] (a)
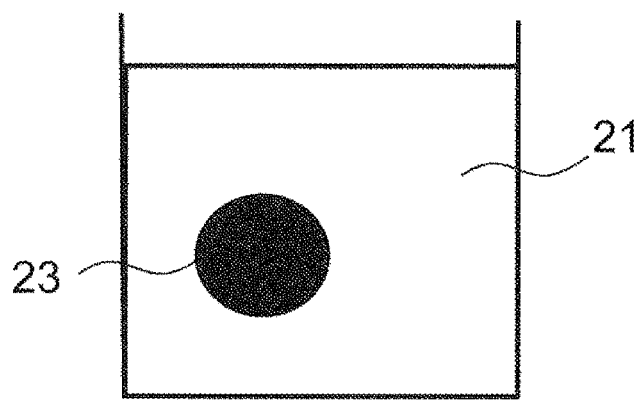
[FIG. 2] (b)

[Fig. 3]
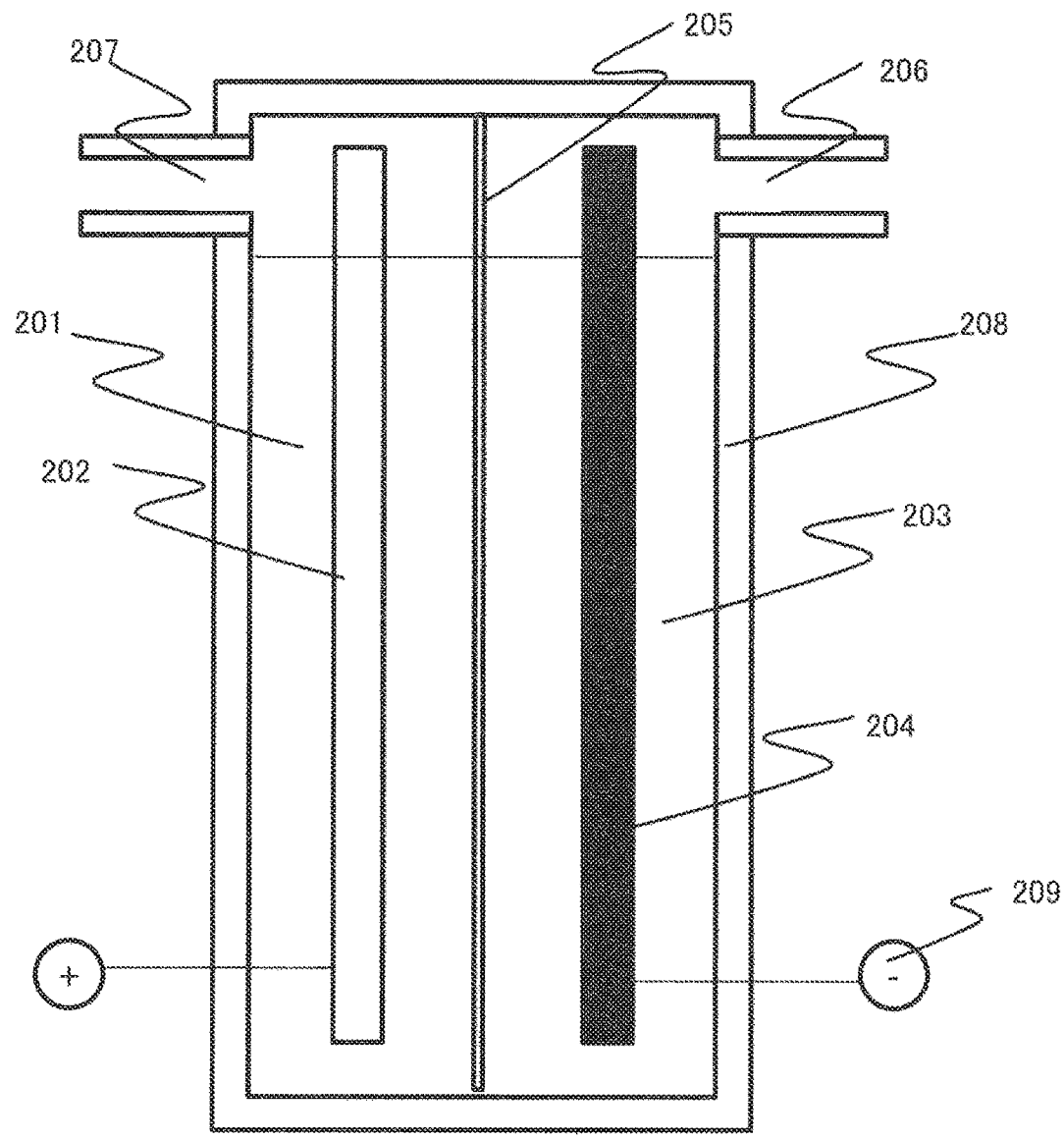
[Fig. 4]
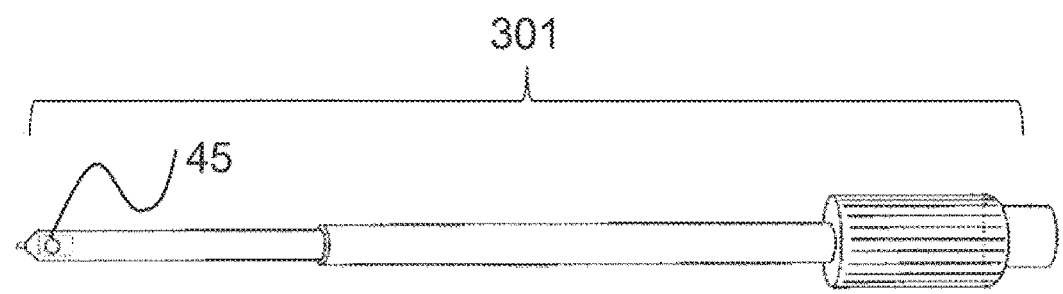

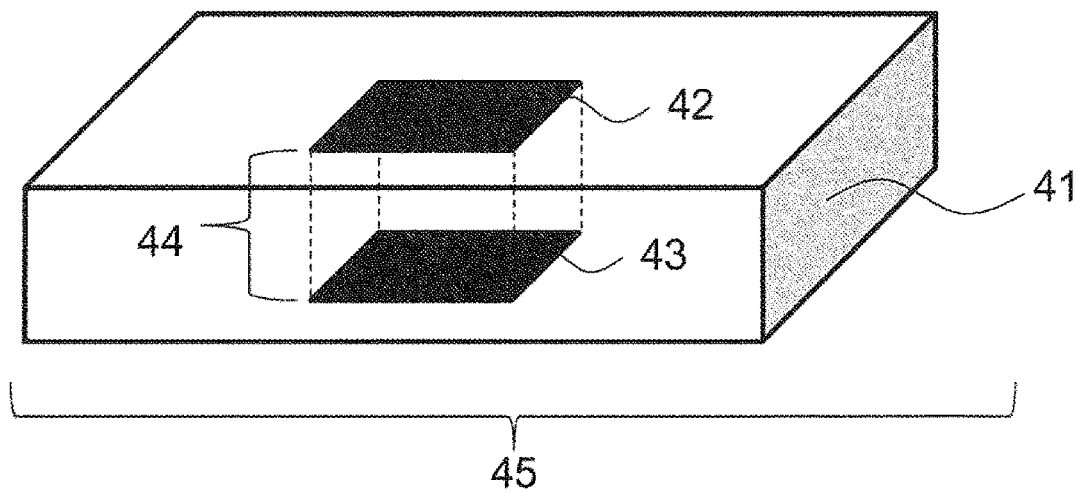
[FIG. 5] (a)
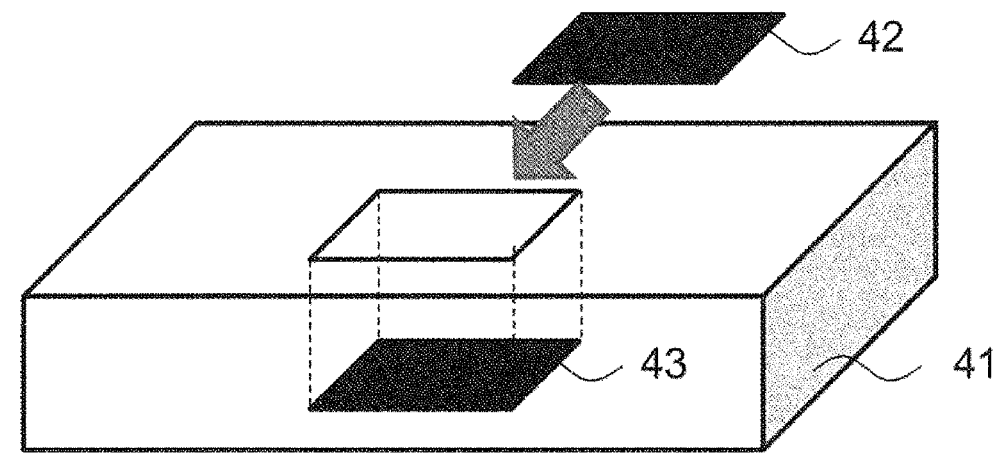
[FIG. 5] (b)
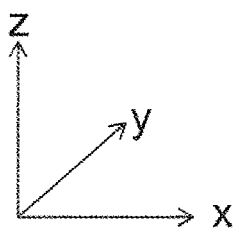

[Fig. 6]
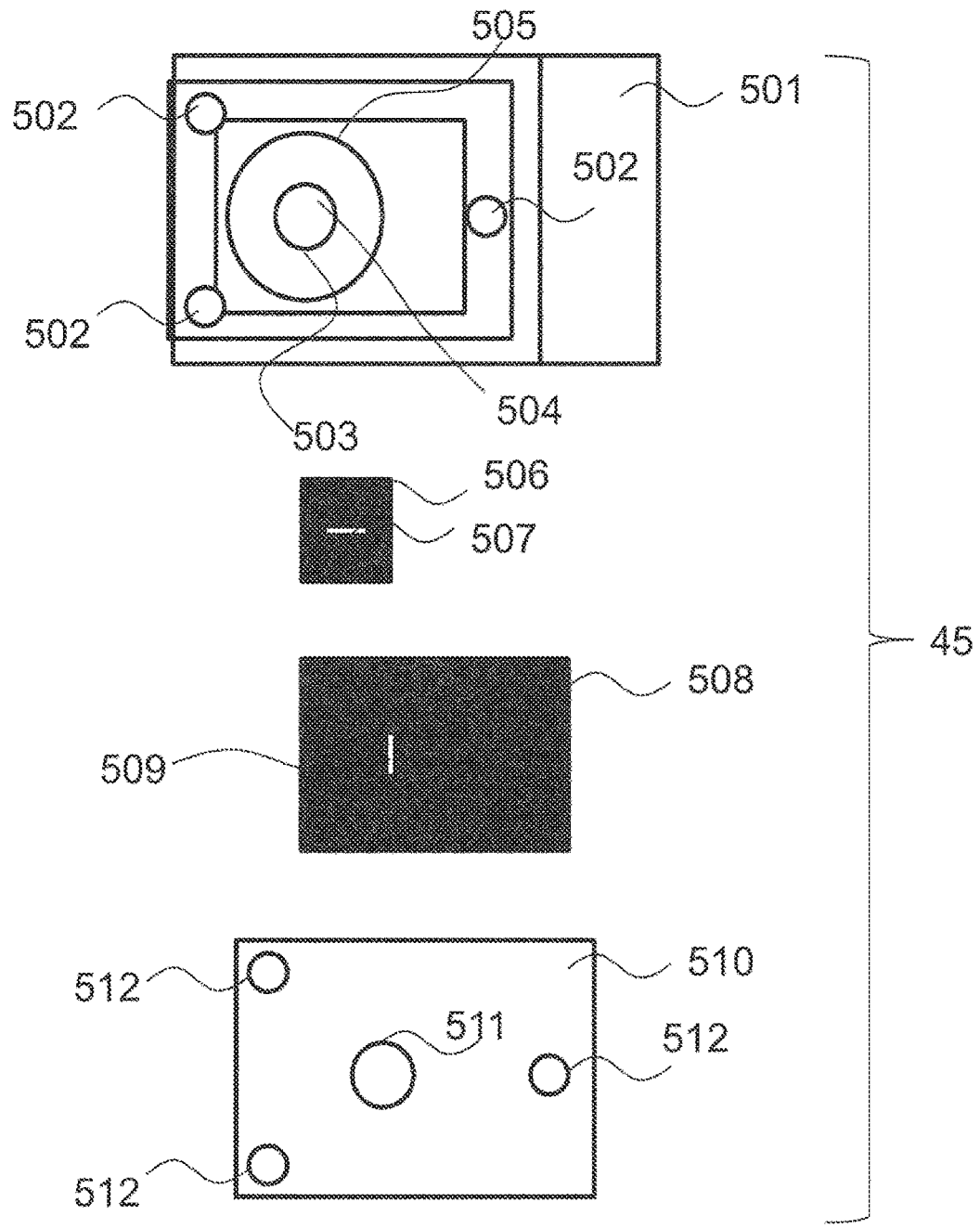

[Fig. 7]
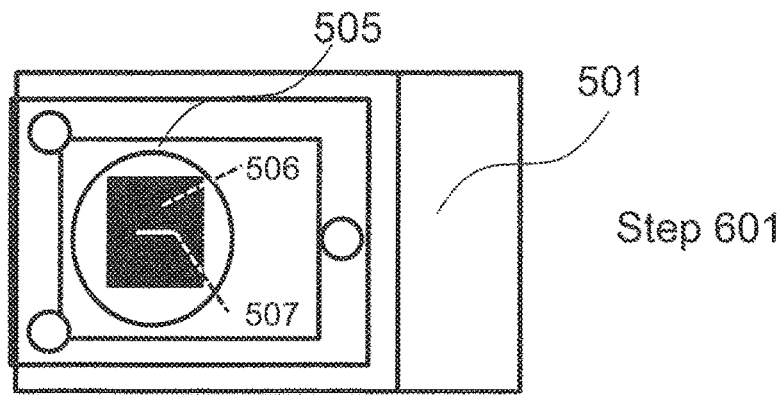
Step 601
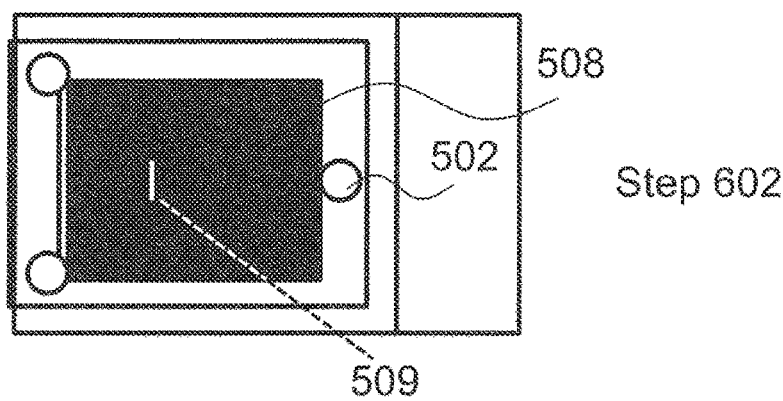
Step 602
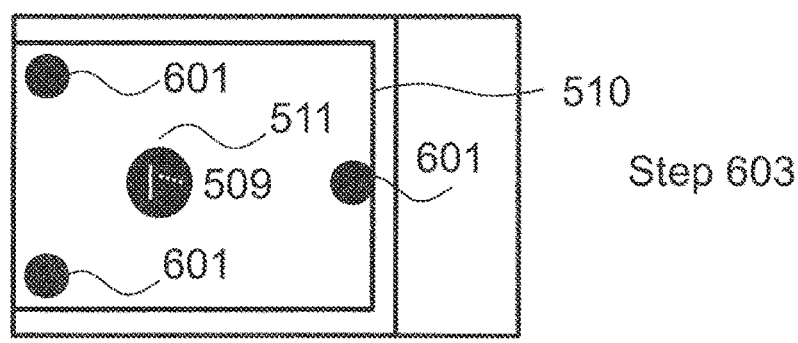
Step 603

[Fig. 8]
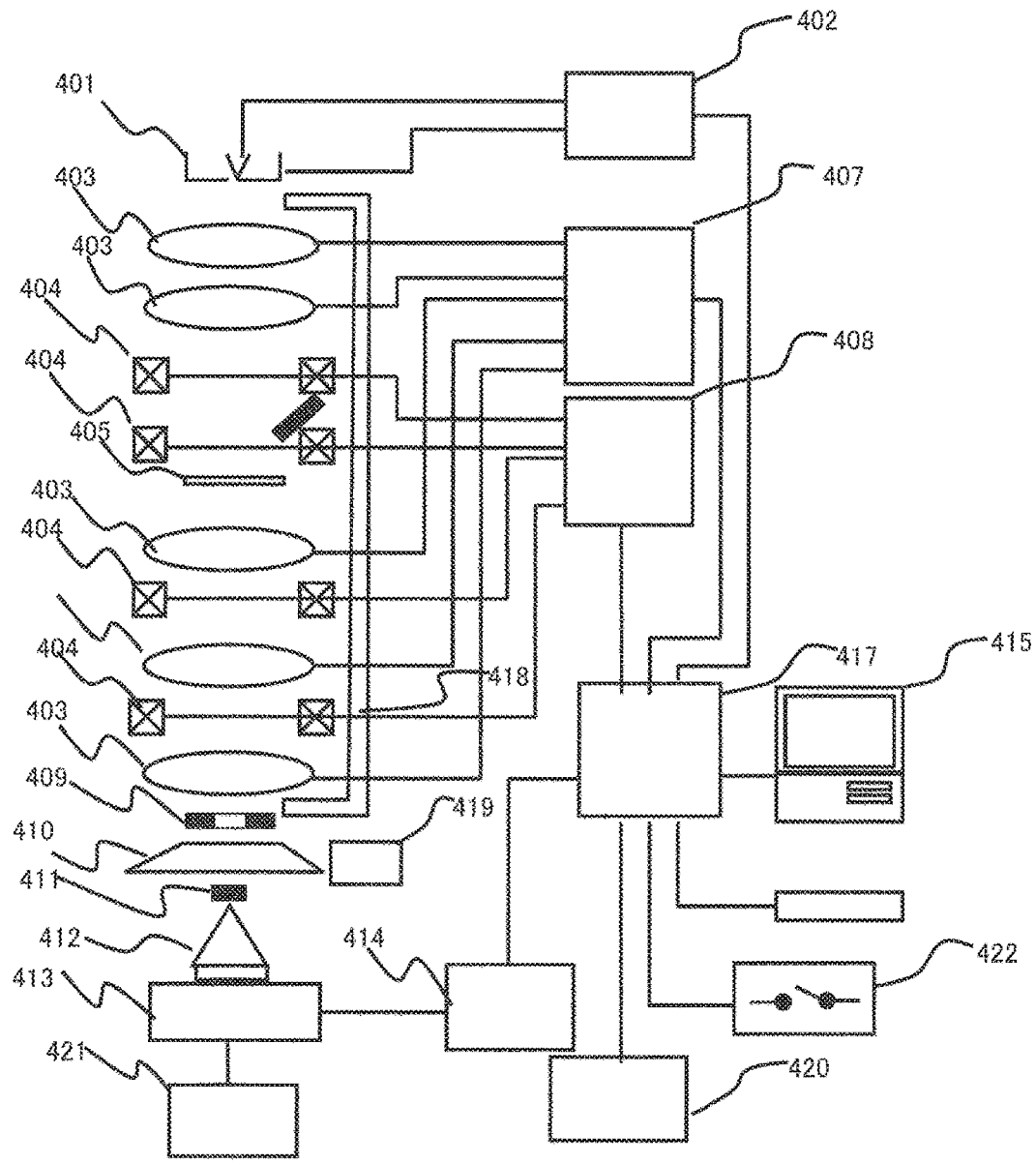

[Fig. 9]
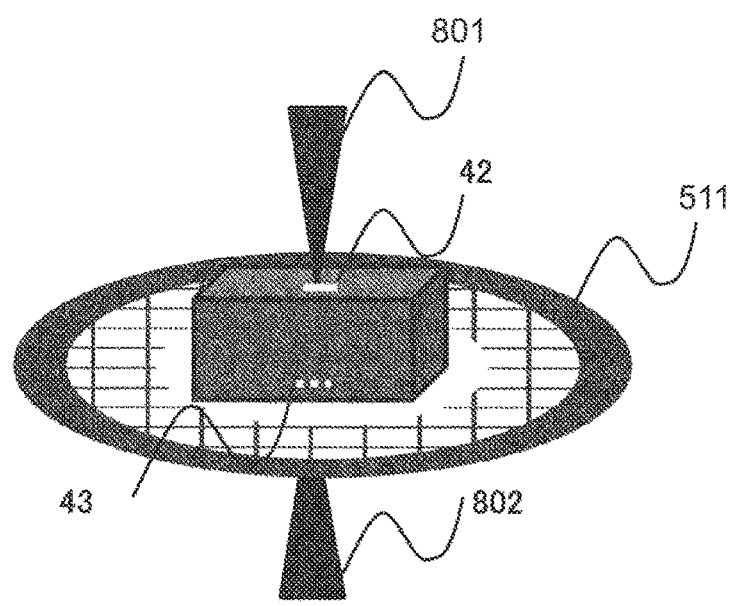

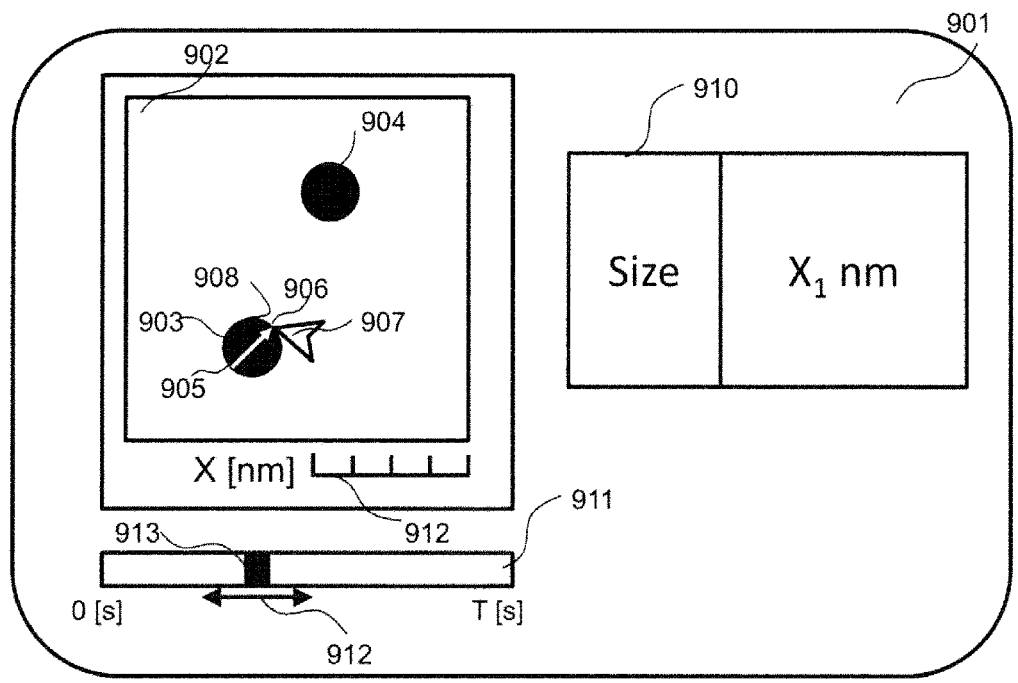
[FIG. 10](a)
$$d = \frac{L}{M}\sqrt{(x_2 - x_1)^2 + (y_2 - y_1)^2}$$
d: LENGTH OF LINE SEGMENT 908 ON SPECIMEN, L: SIZE OF ONE PIXEL ON IMAGING SURFACE OF CAMERA 412, AND M: MAGNIFICATION ON IMAGING SURFACE OF CAMERA 412
($x_1$, $y_1$): COORDINATES OF START POINT 905, ($x_2$, $y_2$): COORDINATES OF END POINT 906
[FIG. 10](b)

SPECIMEN OBSERVATION METHOD

TECHNICAL FIELD

The present invention relates to a specimen observation method. In particular, the present invention relates to an observation method using an ionic liquid and a charged particle beam device. For example, the present invention relates to a method of observing a liquid using an ionic liquid.

BACKGROUND ART

In recent years, bubbles, particularly, bubbles having a very small diameter (referred to as minute bubbles below) have attracted attention because of the breadth of the industrial application range thereof. The application range is very wide, for example, sterilization, washing, promotion of growth of plants are mentioned. Various methods have been proposed for creating bubbles, and as an example, PTL 1 is provided.

CITATION LIST

Patent Literature

PTL 1: JP-A-2011-157580

SUMMARY OF INVENTION

Technical Problem

As a device for observing a specimen, a so-called charged particle beam device exemplified by a scanning electron microscope and a transmission electron microscope is considered. The inventors of this application have conducted intensive studies and have found a problem that contrast as high as an operator can specify bubbles, for example, minute bubbles is not provided in a charged particle beam image of a liquid subjected to processing of generating bubbles.

Solution to Problem

The inventors of this application have conducted intensive studies. As a result, the inventors have found a phenomenon in which contrast as high as an operator can specify bubbles, for example, minute bubbles is provided in a charged particle beam image of a specimen including an ionic liquid and a liquid subjected to processing of generating bubbles. According to the present invention, this phenomenon is used.

For example, according to the present invention, a specimen including an ionic liquid and a liquid subjected to processing of generating bubbles is observed by a charged particle beam device, for example, an electronic microscope.

Advantageous Effects of Invention

According to the present invention, it is possible to recognize bubbles in a liquid, for example, minute bubbles. For example, according to the present invention, it is possible to recognize minute bubbles without freezing a liquid specimen. For example, if a video is captured using the present invention, it is possible to observe the change of minute bubbles with time in an easy-to-understand manner.

BRIEF DESCRIPTION OF DRAWINGS

FIG. 1 is a flowchart of Example 1.

FIGS. 2(a) and 2(b) are diagrams illustrating an interaction between an ionic liquid and minute bubbles.

FIG. 3 is a diagram illustrating a minute bubble generation device.

FIG. 4 is a diagram illustrating a sample holder 301.

FIGS. 5(a) and 5(b) are schematic diagrams illustrating an in-liquid observation tool.

FIG. 6 is a diagram illustrating details of the in-liquid observation tool.

FIG. 7 illustrates a flow of enclosing a specimen in the in-liquid observation tool.

FIG. 8 is a diagram illustrating a transmission electronic microscope.

FIG. 9 is a diagram illustrating a case where a micro-grid 511 on which the in-liquid observation tool 45 is mounted is observed as a sample 405.

FIGS. 10(a) and 10(b) are diagrams illustrating a display screen.

DESCRIPTION OF EMBODIMENTS

Hereinafter, an example of the present invention will be described with reference to the drawings. The following descriptions are provided as just an example. Selecting and deleting any feature from the following descriptions, replacing any feature with another feature, and combining any feature with other features are within the scope of the disclosure of this specification.

Example 1

FIG. 1 is a diagram illustrating a flowchart of the example. Firstly, a solvent (for example, ultra-pure water) and an electrolyte are mixed and stirred (Step 101). Stirring may be performed manually by an operator or by using a stirrer.

Then, predetermined processing is performed on the resultant of Step 101. The predetermined processing can be referred to as minute-bubble generation processing. The minute-bubble generation processing is performed by putting the resultant of Step 101 into a minute bubble generation device and applying a voltage (Step 102). With Step 102, bubbles, for example, minute bubbles are included in a liquid mixture of the ultra-pure water and the electrolyte. The resultant of Step 102 is referred to as minute-bubble water below.

The minute bubble may be referred to as a fine bubble, an ultra-fine bubble, a microbubble, a nanobubble, and a micro-nano bubble, for example. The fine bubble can be expressed as a bubble having a bubble diameter of several tens of micrometers or smaller, for example. More specifically, for example, the fine bubble can be expressed as a bubble having a bubble diameter of 1 micrometer or smaller. In particular, a fine bubble having a bubble diameter of 1 micrometer or smaller can be expressed as an ultra-fine bubble.

Then, an ionic liquid is diluted with a solvent (for example, ultra-pure water) (Step 103). Here, the ionic liquid will be described. The ionic liquid is, for example, a liquid at room temperature, and can be expressed as a liquid including ions. The ionic liquid is not evaporated at all or hardly evaporated in the vacuum. The ionic liquid may include a cation and an anion, for example. The ionic liquid may be hydrophilic or hydrophobic in some cases. Step 103 may be performed in parallel with Steps 101 and 102.

Then, the minute-bubble water and the ionic liquid diluted by Step 103 are mixed, and thereby a specimen is produced (Step 104).

The specimen produced in Step 104 is enclosed in an in-liquid observation tool (details thereof will be described later) (Step 105).

Then, the in-liquid observation tool in which the specimen has been enclosed is mounted on a sample holder. The sample holder on which the in-liquid observation tool is mounted is put into a chamber of a charged particle beam device and an image is obtained (Step 106). As the charged particle beam device, for example, a transmission electronic microscope (referred to as a TEM below) is considered. Other charged particle beam devices such as a scanning transmission electronic microscope (referred to as a STEM below) and a scanning electronic microscope (referred to as a SEM below) may also be used. Step 106 can be expressed, for example, as a capturing step of obtaining a charged particle beam image of a specimen including an ionic liquid and a liquid subjected to processing of generating bubbles.

In a TEM image of a specimen in which the ionic liquid is not used, a region indicating minute bubble is not shown. In a TEM image of a specimen in which the ionic liquid is used, a region indicating minute bubble is shown. This phenomenon has reproducibility. This region is darker than the surroundings, and the shape of the region is substantially a dot or a circle. As described above, the reason of that the region indicating minute bubble can be recognized in a TEM image of a specimen in which the ionic liquid is used is that a difference of the molecular weight between the ionic liquid and other substances is shown with a difference in image contrast, as a result of an interaction between the ionic liquid and the minute bubbles. As the interaction between the ionic liquid and the minute bubbles, for example, as illustrated in FIGS. 2(a) and 2(b), at least one of a case (FIG. 2(a)) where the ionic liquid 23 is attracted to the surface of the minute bubble 22 in the specimen 21 and a case (FIG. 2(b)) where the ionic liquid 23 is replaced with the minute bubble 22 is considered.

Here, details of Step 101 will be described. The electrolyte includes at least one of a carbonate ion, a bicarbonate ion, a nitrate ion, a sulfate ion, a chloride ion, a perchlorate ion, a hydroxide ion, a sodium ion, and a potassium ion. Other well-known electrolytes may be employed. As the concentration range thereof, any range can be employed. As an example, the concentration range may be from 0.1 to 1000 mM.

Next, details of Step 102 will be described. FIG. 3 is a diagram illustrating a fine-bubble generation device. The fine-bubble generation device includes a container 208 for putting an electrolytic solution as the resultant of Step 101, an anode 202, a cathode 204, an ion exchange membrane 205, a gas outlet 206, a discharge port 207, and a power source 209.

The container 208 has a two-chamber structure by the ion exchange membrane 205. The electrolytic solution is divided into an electrolytic solution 201 and an electrolytic solution 203. A side including the anode 202 can be expressed as an anode chamber, and a side including the cathode 204 can be expressed as a cathode chamber. Each of the anode chamber and the cathode chamber includes a supply port for supplying the electrolytic solution. For the ion exchange membrane 205, any material may be employed. As an example, a perfluorosulfonic acid material may be employed.

For the anode 202, any material may be employed. As an example, a conductive diamond catalyst doped with boron may be employed.

For the cathode 204, any material may be employed. As an example, platinum may be employed.

Conducting is performed on such a two-chamber structure, and thus minute bubbles of a predetermined particle size, for example, ozone fine bubbles are generated in the anode chamber. A hydrogen gas is generated in the cathode chamber. The electrolytic solution including the minute bubbles, that is, the above-described minute-bubble water is discharged from the discharge port 207.

The method of generating minute bubbles is not limited to the above-described conducting method (Method 1). Any of a method using an ultrasonic wave (Method 2), a method using a swirl flow (Method 3), a pressurized dissolution method (Method 4), and a method using micropores (Method 5) may be employed. As described above, minute bubbles can be expressed by the nomenclature or the bubble diameter. However, bubbles generated by at least one of Method 1 to Method 5 described above can be expressed as the minute bubbles.

Next, the in-liquid observation tool for enclosing the specimen will be described. FIG. 4 is a diagram illustrating the sample holder for a transmission electronic microscope which will be described later. The in-liquid observation tool 45 is provided at the tip of the sample holder 301.

FIGS. 5(a) and 5(b) are schematic diagrams illustrating the in-liquid observation tool 45. As illustrated in FIG. 5(a), the in-liquid observation tool 45 includes a board 41, a space 44 formed to penetrate the board 41, a first observation window 42 and a second observation window 43 which are disposed to close the openings of the space 44. At least one of the first observation window 42 and the second observation window 43 is detachable. The first observation window 42 and the second observation window 43 are formed of a transparent material for charged particles. For example, silicon nitride is exemplified as the material. As illustrated in FIG. 5(b), the specimen is supplied to the space 44, and then, is enclosed by closing the openings with the first observation window 42. Thus, the specimen is enclosed in the in-liquid observation tool 45.

FIG. 6 is a diagram illustrating details of the in-liquid observation tool 45 in a Z-direction in FIGS. 5(a) and 5(b). The in-liquid observation tool 45 includes a base 501, a first cover 506, a second cover 508, and a third cover 510. The base 501 includes a screw hole 502, a first O-ring 503, an electron beam passing portion 504, and a second O-ring 505. An observation window 507 is formed in the first cover 505. An observation window 509 is formed in the second cover 508. The observation window 507 and the observation window 509 are made of a transparent material for a charged particle beam, for example, silicon nitride. The third cover 510 includes an opening 511 and a screw hole 512. The electron beam passing portion 504 is an opening or is made of a transparent material for a charged particle beam.

The electron beam passing portion 504 is provided on the inner side of the first O-ring 503. The first O-ring 503 is provided in the second O-ring 505. The first cover 506 is smaller than the second cover 508. The second cover 508 is smaller than the third cover.

FIG. 7 is a diagram illustrating a flow (Step 105 in FIG. 1) of enclosing the specimen in the in-liquid observation tool in FIG. 6. Firstly, the first cover 506 is mounted on the base 501 and the specimen is supplied onto the first cover 506 (Step 601). More specifically, the first cover 506 is disposed to cover the first O-ring 503 and to be in on the inner side of the second O-ring 505. The observation window 507 is in the inner side of the electron beam passing portion 504. In this state, the specimen is supplied onto the first cover 506.

Then, the second cover 508 is disposed on the first cover 506 (Step 602). More specifically, the second cover 508 is disposed to be on the inner side of the screw hole 502. Projection of a portion of at least the observation window 509 has a relationship of overlapping a portion of the observation window 507.

Then, the third cover 510 is disposed on the second cover 508 and is fixed by a screw 601 (Step 603). At this time, the observation window 509 is provided on the inner side of the opening 511. The screw hole 502 and the screw hole 512 have a relationship of coinciding with each other. The third cover 508 can be fixed to the base 501 by the screw 601.

The observation window 509 has a function of the first observation window 42 in FIGS. 5(a) and 5(b). The observation window 507 has a function of the second observation window 43 in FIG. 5. Thus, charged particles supplied to the observation window 509 reach the enclosed specimen, and the charged particles transmitted through the specimen are emitted to the outside of the in-liquid observation tool 45 via the observation window 507. A charged particle beam image can be obtained by a detector or a camera detecting electrons transmitted through the specimen.

Such an in-liquid observation tool can be expressed, for example, as a container that holds the specimen in a liquid state even in a vacuum chamber of the charged particle beam device, through which the charged particle beam can be transmitted, and through which electrons from the specimen can be transmitted. The in-liquid observation tool is not limited to that in the example and may employ any structure.

The in-liquid observation tool may be used in a so-called in-situ observation. The in-situ observation can be expressed as an observation which is performed while energy is applied to the specimen or an observation of capturing a change of the specimen with time. In a case where the in-situ observation is performed, the in-liquid observation tool includes an in-situ observation mechanism. As an example of the in-situ observation mechanism, for example, at least one of two or more electrodes (voltage applying step) for applying a voltage to the specimen, a temperature control mechanism (temperature control step) that changes the temperature of the specimen, a supply source that supplies a medium (for example, a liquid or a gas) to the specimen and a tube (medium supplying step), and a circulation mechanism (circulating step) that includes a flow passage for circulating the specimen. According to at least one of the voltage applying step, the temperature control step, and the medium supplying step, it is possible to observe the chemical change of the minute bubbles. According to the circulating step, it is possible to observe movement of the minute bubbles. In a case where the in-situ observation is performed, if a minute bubble image is acquired in a form of a video, the change of the minute bubbles is easily understood by the operator.

Next, an observation device that observes the specimen will be described. As an example of the observation device, a charged particle beam device, for example, a transmission electronic microscope is exemplified. FIG. 8 is a diagram illustrating a transmission electronic microscope in the example.

Regarding an electron beam emitted from the electron gun 401, control for ON/OFF, intensity, or the like is performed by the high-voltage control unit 402. The electron beam emitted from the electron gun 401 is focused by a lens 403, and the position of the electron beam on the sample surface is adjusted by a deflection coil 404. As a result, the electron beam is applied to any position on the surface of the sample 405.

The lens 403 and the deflection coil 404 are controlled by a lens control unit 407 and a deflection coil control unit 408.

A TEM image is imaged on a fluorescent plate 410. If the fluorescent plate 410 moves to a position at which the electron beam is not completely hit, a TEM image is imaged on a film 413 in a camera 412 below the fluorescent plate, and thus the TEM image can be acquired. The camera 412 is controlled by a camera control unit 414. The camera 412 is not limited to a camera using a film. The camera 412 also includes a digital type camera using an image pickup device (for example, a CCD or a CMOS) instead of the film.

Next, a case using a scan-image observation function (STEM function) will be described. In this case, the electron beam is narrowly focused by the lens 403 and is further deflected by the deflection coil 404. As a result, scanning with an electron beam is performed on a desired two-dimensional region on the sample 405. If the sample 405 is irradiated with the electron beam, transmission electrons, secondary electrons, scattered electrons, and the like are generated. It is possible to acquire a transmission electron image, a secondary electron image, or a scattered electron image by a detector detecting the transmission electron transmitted through the sample, or the secondary electrons or the scattered electrons which have been generated from the sample 405. At this time, the generated scattered electrons are controlled such that a scattering angle is controlled by the lens 403 below the sample so as to normally enter the scattered electrons to an annular dark-field scan image detector 409. The acquired images are supplied to the control units, respectively. A scan image (dark-field STEM image) synchronized with scanning with the electron beam is displayed in a personal computer 415.

The control unit includes a memory storing a control algorithm, a CPU for executing the algorithm, and an I/O interface that transmits and receives a signal. The personal computer 415 includes memory storing an image, a CPU that performs predetermined processing such as reading data from the memory or writing data in the memory, an input unit (for example, a mouse and a keyboard), and an output unit (for example, a display).

In addition, the transmission electronic microscope in the example includes a bright-field scan image detector 411 for acquiring a bright-field STEM image, an electron dose measuring device 421, an interface unit 417, an on/off switch 422, a mirror-body cooling water flow 418, a mirror-body cooling-device control unit 419, and an external storage device 420. The electron dose measuring device 421 measures an electron dose with which the fluorescent plate 410 has been irradiated. In a case of an image captured on the film 413, it is possible to obtain a desired image by controlling the electron dose and the exposure time using the electron dose measuring device 421. The camera control unit 414 controls the shutter of the camera 412. The interface unit 417 connects all the control units to the personal computer 415 and includes a bus or an I/O interface. The on/off switch 422 is for the main power source. The device can be stopped by causing the on/off switch 422 to turn off. The mirror-body cooling water flow 418 is a flow passage of cooling water for cooling a mirror body. The mirror-body cooling-device control unit 419 controls the flow rate ((l/min) of the cooling water.

The external storage device 420 is a storage medium for storing information of each of the control units and the obtained images. The external storage device may be a storage medium having capacity larger than that of the memory in the personal computer 415. The obtained images and videos can be stored in at least one of the internal memory of the personal computer 415 and the external storage device 420. The CPU in the personal computer 415 can perform predetermined image processing on the obtained image and video.

The in-liquid observation tool 45 can be directly connected to or be formed at the tip of the sample holder 301. In addition, as illustrated in FIG. 9, the in-liquid observation tool can be mounted on the tip of the sample holder 301 via a micro-grid 511 which is a set of minute openings. An electron beam 801 passes through the observation window 42 and reaches the specimen. The transmission electrons 802 transmitted through the specimen pass through the openings in the micro-grid 511 and the observation window 43 on an opposite side of the observation window 42. It is possible to acquire a TEM image of the specimen by detecting the transmission electrons 802.

Next, an evaluation of dimensions of the minute bubbles will be described. FIG. 10(a) is a diagram illustrating a GUI displayed by the output unit of the personal computer 415. A TEM image 902 is displayed in a GUI 901. In the example, descriptions will be made, for example, on the assumption that the TEM image 902 includes minute bubble regions 903 and 904. The operator can draw a line segment 908 from a certain starting point 905 to a certain end point 906 in the minute bubble region 903 with a pointer 907. The CPU in the personal computer 415 obtains the length of the line segment 908 on the specimen, based on the model in FIG. 10(b). The obtained length is displayed on a window 910. The similar procedure can be applied to the fine bubble region 904. The coordinates of the start point 905 and the end point 906 can be obtained by selection of the pointer 907. If L and M are known, the length of the line segment 908 on the specimen can be obtained. As described above, the length of the line segment 908 on the specimen can be obtained based on the coordinates of the start point 905, the coordinates of the end point 906, information regarding the dimensions of the image, and information regarding magnification. Using a model other than the model in FIG. 10(b) is also within the scope of the disclosure of this specification.

It is possible to obtain the dimensions of fine bubbles even though the above procedure is not performed or by visually comparing the scale 912 attached to the TEM image to the minute bubble regions 903 and 904.

In a case of acquiring a video, a time scale 911 can be displayed. The time scale 911 means a video capturing time. Any capturing time point can be designated in a manner that a bar 913 is moved in a direction indicated by an arrow 912, by the pointer 907. If a certain capturing time point is designated, the CPU reads a TEM image of the designated time point from the memory and displays the TEM image on the GUI 901. With this operation, the operator can evaluate the dimensions of minute bubbles at any time point. The method of evaluating minute bubbles is not limited to the above method. As described above, the step of obtaining the dimensions of minute bubbles can be expressed, for example, as a measuring step of obtaining the dimensions of a predetermined region in a charged particle image.

As described above, in the example, it is possible to recognize bubbles in a liquid, for example, minute bubbles by using the ionic liquid. More specifically, it is possible to cause the minute bubbles in a liquid to be in a recognizable state, without freezing the specimen. It is possible to evaluate the dimensions of the minute bubbles in a liquid by using the image.

Here, variations of the ionic liquid will be described. Specific examples of the hydrophilic ionic liquid include 1-ethyl-3-methylimidazolium tetrafluoroborate, 1-ethyl-3-methylimidazolium trifluoromethanesulfonate, 1-butyl-3-methylimidazolium tetrafluoroborate, 1-butyl-3-methylimidazolium trifluoromethanesulfonate, 1-hexyl-3-methylimidazolium bromide, 1-hexyl-3-methylimidazolium chloride, and 1-decyl-3-methylimidazolium chloride.

As the hydrophobic ionic liquid, 1-butyl-3-methylimidazolium bis(trifluoromethanesulfonyl)imide (BMI-TFSI) is exemplified.

Hitherto, the example of the present invention is described. The present invention is not limited to the above example. Regarding the steps in FIGS. 1 and 6, all the steps are not essential. The configuration of the charged particle beam device is not limited to that in FIG. 8. Acquiring a video by continuously acquiring an image (for example, a TEM image) is also within the scope of the disclosure of this specification. The present invention can be widely applied to production of the specimen or evaluation of bubbles. A form in which the ionic liquid is applied to a liquid that may include bubbles is within the scope of this specification. A concept in which an observer can determine a boundary between a predetermined region and the surrounding region in an image of a liquid that may include bubbles is also within the scope of the disclosure of this specification.

REFERENCE SIGNS LIST

201 ELECTROLYTIC SOLUTION
202 ANODE
203 ELECTROLYTIC SOLUTION
204 CATHODE
205 ION EXCHANGE MEMBRANE
206 GAS OUTLET
207 DISCHARGE PORT

The invention claimed is:

1. A specimen observation method comprising:
   a capturing step of obtaining a charged particle beam image of a specimen including an ionic liquid and a liquid subjected to processing of generating bubbles,
   wherein the capturing step includes an in-situ observing step of the specimen, and
   wherein the in-situ observing step includes a circulating step of circulating the specimen through a flow passage for observing movement of said bubbles with time.

2. The specimen observation method according to claim 1, further comprising:
   an enclosing step of enclosing the specimen in a container including a transparent portion for a charged particle,
   wherein the enclosing step is performed before the capturing step.

3. The specimen observation method according to claim 1,
   wherein the ionic liquid includes a cation and an anion.

4. The specimen observation method according to claim 1,
   wherein the bubbles are fine bubbles.

5. The specimen observation method according to claim 1, further comprising:
   a measuring step of obtaining dimensions of a predetermined region in the charged particle beam image,
   wherein the predetermined region is darker than the surroundings thereof.

6. The specimen observation method according to claim 1,
   wherein the capturing step includes a video obtaining step of obtaining a video of the specimen.

7. The specimen observation method according to claim 1,
wherein the in-situ observing step includes a voltage applying step of applying a voltage to the specimen.

8. The specimen observation method according to claim 1,
wherein the in-situ observing step includes a temperature control step of changing a temperature of the specimen.

9. The specimen observation method according to claim 1,
wherein the in-situ observing step includes a medium supplying step of supplying a medium to the specimen.

10. The specimen observation method according to claim 1,
wherein the charged particle beam image is a transmission electron image.

11. The specimen observation method according to claim 1,
wherein the charged particle beam image is a scanning electron microscope image.

12. A specimen observation method comprising:
a capturing step of obtaining a charged particle beam image of a specimen including an ionic liquid and a liquid capable of generating bubbles,
wherein the capturing step corresponds to an in-situ observation of bubbles, and
wherein the in-situ observing step includes a circulating step of circulating the specimen through a flow passage for observing movement of said bubbles with time.

* * * * *